United States Patent [19]

Callies et al.

[11] Patent Number: 4,835,040
[45] Date of Patent: May 30, 1989

[54] CONTINUOUS VAPOR DEPOSITION METHOD FOR PRODUCING A COATED GLASS ARTICLE

[75] Inventors: Gerald A. Callies; Eberhard R. Albach, both of Toledo; John F. Conour, Maumee; Richard A. Herrington, Walbridge, all of Ohio

[73] Assignee: Libbey-Owens-Ford Co., Toledo, Ohio

[21] Appl. No.: 19,190

[22] Filed: Feb. 26, 1987

Related U.S. Application Data

[62] Division of Ser. No. 784,976, Oct. 7, 1985, Pat. No. 4,661,381.

[51] Int. Cl.[4] .............................................. C03C 15/00
[52] U.S. Cl. ..................... 428/215; 428/336; 428/337; 428/341; 428/420; 428/428; 428/448; 428/913; 428/333
[58] Field of Search ........ 428/420, 426, 428, 446–448, 428/333, 336, 337, 341, 913, 215

[56] References Cited

U.S. PATENT DOCUMENTS 4,100,330  7/1978  Donley .................................. 428/429
4,636,439  1/1987  Breininger .......................... 428/428

Primary Examiner—Ellis P. Robinson
Assistant Examiner—P. R. Schwartz
Attorney, Agent, or Firm—Marshall & Melhorn

[57] ABSTRACT

A continuous, chemical vapor deposition method for producing a coated glass article is disclosed. A glass substrate is advanced continuously, while hot, past first and second treating stations. A non-oxidizing atmosphere is maintained in the vicinity of the first treating station, while an oxidizing atmosphere is maintained in the vicinity of the second station. A non-oxidizing gas which contains a silane, e.g., $SiH_4$, is directed from the first treating station against a surface of the glass to form a silicon coating on that surface. An oxidizing gas which includes a metal compound in the vapor phase is directed from the second station against the silicon-coated surface of the article. The process is controlled so that the silane-containing gas forms a reflective silicon coating on the glass surface, the oxidizing gas which includes a metal compound forms a coating of an oxide of the metal, and oxidation before the article reaches the second treating station forms a silicon oxide layer on the silicon which is of sufficient thickness that the metal oxide layer is substantially free of pinholing.

14 Claims, 1 Drawing Sheet

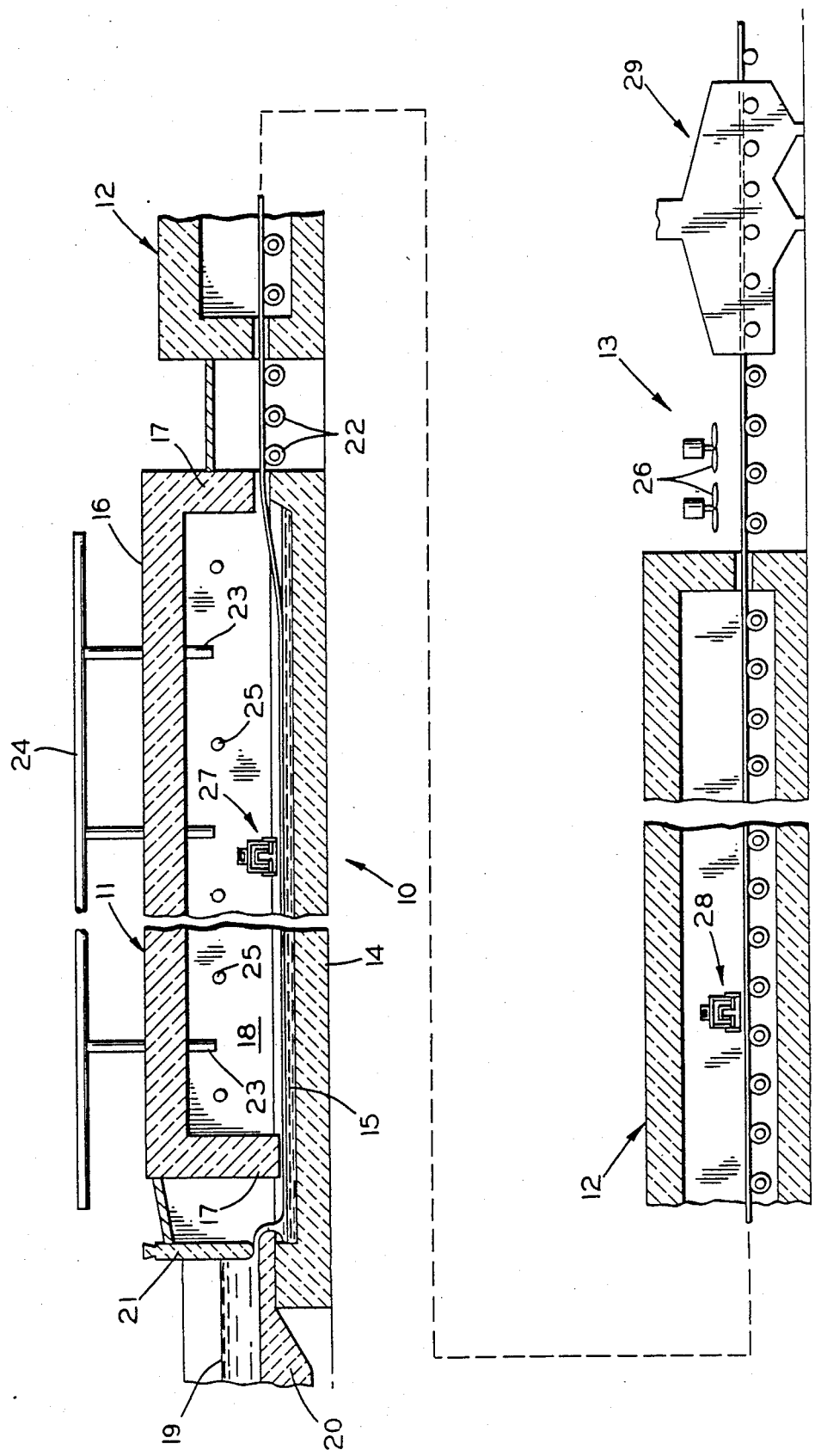

CONTINUOUS VAPOR DEPOSITION METHOD FOR PRODUCING A COATED GLASS ARTICLE

This is a division of application Ser. No. 784,976 filed Oct. 7, 1985, now U.S. Pat. No. 4,661,381.

BACKGROUND OF THE INVENTION

1. Field of the Invention

This invention relates to a continuous, chemical vapor deposition method for producing a coated glass article, particularly, coated architectural glass, and to the coated article so produced. In a specific embodiment, the invention relates to such a method for producing a glass article coated with a layer of silicon formed by treatment with a non-oxidizing gas comprising mono-silane ($SiH_4$), a silicon oxide layer formed by oxidation of the surface of the silicon layer, and, on the silicon oxide layer, a layer of tin oxide formed by treatment with an oxidizing gas comprising tetramethyl tin. The invention also includes the step of washing the coated glass article with dilute hydrofluoric acid to prevent the formation of a film over the coating during subsequent tempering.

2. The Prior Art

The production of architectural glass coated with silicon formed by continuous chemical treatment with a non-oxidizing gas comprising mono-silane is disclosed in U.S. Pat. No. 4,019,887, "Kirkbride et al.". The method disclosed by Kirkbride et al. is suitable for carrying out one step of the method of the instant invention, namely, that of forming a layer of a silicon coating on a glass article.

The addition of ethylene to the Kirkbride et al. non-oxidizing gas comprising mono-silane is disclosed in U.S. Pat. No. 4,188,444, "Landau", as is the benefit derived from such use of ethylene that the silicon coating has significantly improved resistance to alkali.

The use of tetramethyl tin and other organo-tin compounds to produce tin oxide coatings on glass by chemical vapor deposition is disclosed in U.S. Pat. No. 4,187,336, "Gordon".

The production of a glass article having a surface coated with a layer of silicon produced by the method of Kirkbride et al. and additionally coated with a layer of a metal oxide, deposited on the silicon, is disclosed by U.S. Pat. No. 4,100,330, "Donley". The metal oxide layer, Donley discloses, can be formed by spraying the glass article to which the Kirkbride et al. silicon coating has been applied with a solution in a suitable solvent of nickel acetylacetonate, of titanium diisopropyldiacetylacetonate, of dibutyl tin diacetate, or of two or more of cobalt acetylacetonate, iron acetylacetonate, chromium acetylacetonate and nickel acetylacetonate. According to test data in Donley, the Kirkbride et al. silicon coating is removed by both cerium oxide and pumice used according to twenty stroke abrasion tests and by a thirty second immersion in a hot sodium hydroxide solution, while the metal oxide coatings, sometimes applied directly to a glass surface and sometimes over the Kirkbride et al. silicon coatings thereon, are not removed by the procedures of the abrasion tests or by immersion in the hot sodium hydroxide solution.

Most architectural glass is produced by the "Float Glass Process", a part of which is shown in the drawings of Kirkbride et al. This process involves casting glass onto a molten tin bath which is suitably enclosed, transferring the glass, after it cools sufficiently, to rolls that are aligned with the bath, and cooling the glass as it is advanced on the rolls, first through a lehr and, finally, while exposed to ambient conditions. A non-oxidizing atmosphere is maintained in the float portion of the process, in contact with the tin bath, to prevent oxidation, while an air atmosphere is maintained in the lehr.

It will be appreciated that it would be advantageous, when it is desired to coat glass first with silicon and second with tin or another oxide, to do so in conjunction with the production thereof by the Float Glass Process. The glass is at a suitable temperature, as is disclosed by Kirkbride et al., in the float portion of the process for treatment to apply a silicon coating; it is also at a suitable temperature in some parts of the lehr, which contains air, for treatment of a surface thereof with an oxidizing gas comprising tetramethyl tin to form a tin oxide coating on the silicon. However, when gas distributors were installed in a float glass line to treat glass first when it was at a temperature of about 1170° F. (632° C.) and in a non-oxidizing atmosphere, and second when it was at a temperature of about 1125° F. (607° C.) and in air, and glass on the line was treated first with a gas composed of 86 percent by volume of nitrogen, 4 percent by volume of ethylene and 10 percent by volume of mono-silane and second with a gas composed of 99 percent by volume of air and 1 percent by volume of tetramethyl tin, successive silicon and tin oxide coatings were formed on the glass, but the appearance of the coated glass was aesthetically unacceptable because of defects which have been called "pinholes". Overall, the coated glass had a bronze transmitted color and a silver reflective color, but there were numerous, generally circular areas, pinholes, which had a lighter transmitted color.

THE INSTANT INVENTION

The present invention is based upon the discovery that glass being produced by the Float Glass Process can be coated immediately after it has been cast, first with silicon and second with tin or another oxide, provided that the treatment which forms the tin or other oxide coating is applied after the previously applied silicon coating has oxidized to a sufficient extent.

BRIEF DESCRIPTION OF THE DRAWING

The single Figure drawing is a somewhat schematic view in vertical section of apparatus for practicing the Float Glass Process which additionally includes two gas distributors suitably positioned to enable the practicing of the method of the instant invention.

DESCRIPTION OF THE PREFERRED EMBODIMENTS

Referring to the drawing, apparatus for practicing the Float Glass Process, indicated generally at 10, comprises a float section 11, a lehr 12 and a cooling section 13. The float section 11 has a bottom 14 which contains a tin bath 15, a top 16, sidewalls (not illustrated) and walls 17 which form seals so that there is an enclosed zone 18 within which a non-oxidizing atmosphere is maintained, as subsequently described in more detail, to prevent oxidation of the tin bath 15.

In operation of the apparatus 10, molten glass, as indicated at 19, is cast onto a hearth 20, and flows therefrom under a metering wall 21 and downwardly onto the surface of the tin bath 15, from which it is picked up by rolls 22 and conveyed through the lehr 12 and the cooling section 13.

A non-oxidizing atmosphere is maintained in the float section 11 by introducing a suitable gas, for example one composed of 99 percent by volume of nitrogen and 1 percent by volume of hydrogen, into the zone 18 through conduits 23 which are operably connected to a manifold 24. The gas is introduced into the zone 18 from the conduits 23 at a rate sufficient to make up for losses (some of the atmosphere leaves the zone 18 by flowing under the walls 17) and to maintain a slight positive pressure, say 0.001 to 0.01 atmosphere above ambient. The metal bath 15 and the enclosed zone 18 are heated by radiant heat directed downwardly from heaters 25. The atmosphere in the lehr 12 is air, while the cooling section is not enclosed, ambient air being blown onto the glass by fans 26.

The apparatus 10 also includes a gas distributor 27 in the float zone 11 and a gas distributor 28 in the lehr 12.

The following Example, which constitutes the best mode presently contemplated by the inventors, is presented solely for the purpose of further illustrating and disclosing, and is not to be construed as a limitation on, the invention:

EXAMPLE

The apparatus 10 was used to practice the method of the instant invention by producing coated sheet glass. Heat absorbing, bronze colored glass containing about 14 percent by weight of $Na_2O$, 73 percent by weight of $SiO_2$, 8.5 percent by weight of CaO, 0.32 percent by weight of $Fe_2O_3$, 0.19 percent by weight of $Al_2O_3$, 0.01 percent by weight of $TiO_2$, 4 percent by weight of MgO, 0.003 percent by weight of $Co_3O_4$, and 0.0015 percent by weight of Se was charged onto the hearth 20 and caused to flow onto the tin bath 15 as a sheet twelve feet (3.6 meters) wide and ¼ inch (6.4 mm.) thick. The sheet was advanced through the apparatus 10 at a speed of about 25 feet (7.6 meters) per minute. The glass temperature was 2000° F. (1093° C.) on the hearth 20. A non-oxidizing atmosphere was maintained in the zone 18 by introducing a gas thereinto from the conduits 23 to maintain a positive pressure above ambient of 0.006 atmosphere; the gas was composed of 99 percent by volume of nitrogen and 1 percent by volume of hydrogen. Nothing was done to control the atmosphere in the lehr 12; as a consequence, the oxidizing atmosphere therein was air. The glass was treated as it traveled under the distributor 27 by a gas composed of 86 volume percent of nitrogen, 10 volume percent of monosilane and 4 volume percent of ethylene and, as it traveled under the distributor 28, by a gas composed of 99 volume percent of air and 1 volume percent of tetramethyl tin. After the glass cooled to about 100° F. (38° C.) in the cooling section 13, it was washed in an acid washer, shown schemically at 29, for about ten seconds with 4 percent by weight hydrofluoric acid. The nitrogen gas flowed from the distributor 27 at a rate of 2.3 standard cubic feet (0.065 standard cubic meter) per minute, while the air-tetramethyl tin gas flowed from the distributor 28 at a rate of 10 standard cubic feet (0.28 standard cubic meter) per minute. The glass advanced from the distributor 27 to the discharge end of the float zone 11 in from about 90 to 120 seconds, from the distributor 27 to the distributor 28 in about 8 minutes. The glass temperature was 1175°±20° F. (635°±11° C.) under the distributor 27; 970±20° F. (521°±11° C.) under the distributor 28.

The glass produced as described in the foregoing Example carried a multi-layer reflective coating. The reflective coating was silicon, 300 A thick, on the glass; there was a silicon oxide film 20 to 50 A thick on the silicon, and a tin oxide film 200 A thick on the silicon oxide. The coated glass had a shading coefficient of 0.45 to 0.55, daylight reflectance of 45 percent, daylight transmittance of 25 percent, solar transmittance of 30 percent. The transmitted color was a warm bronze, the reflective color silver. The coated glass was post temperable; it has been found to be compatible with most insulated glass and glazing sealants, to have excellent durability, and to have sufficiently low absorption that it requires no heat treating. The coated glass, when the step of washing with hydrofluoric acid was omitted, required washing after it was tempered to remove a film which formed during tempering.

The procedure described in the foregoing Example has also been used to coat gray, heat-absorbing glass composed approximately of 73 percent by weight of silica, 14 percent by weight of $Na_2O$, 8.6 percent by weight of CaO, 4 percent by weight of MgO, 0.19 percent by weight of $Al_2O_3$, 0.29 percent by weight of $Fe_2O_3$, 0.008 percent by weight of $Co_3O_4$, 0.001 percent by weight of Se, 0.0086 percent by weight of NiO, and 0.01 percent by weight of $TiO_2$. The transmitted color of the final product was gray, the reflective color silver; the shading coefficient was 0.45, the daylight reflectance 45 percent, daylight transmittance 20 percent and solar transmittance 29 percent. The film is sufficiently low absorbing that it does not require heat treating; it was post-temperable, had excellent durability, and was compatible with most insulated glass and glazing sealants. When the procedure was repeated except that the step of washing with hydrofluoric acid was omitted, the coated glass, after tempering, showed a slight haze which could be removed by washing. The step of washing with hydrofluoric acid prevented formation of the haze.

It will be appreciated that various changes and modifications can be made from the specific details of the invention as incorporated in the foregoing Example without departing from the spirit and scope thereof as defined in the appended claims. In its essential details, the invention is a continuous chemical vapor deposition method for producing a coated glass article. The method comprises the steps of continuously advancing the article, while hot, past first and second successive treating stations. The first treating station is in a closed zone in which a non-oxidizing atmosphere is maintained. An oxidizing atmosphere is maintained in the vicinity of the second treating station. In the foregoing Example, the non-oxidizing atmosphere in the enclosed zone in which the first treating station is positioned was maintained by introducing thereinto a gas composed of 99 percent by volume of nitrogen and 1 percent by volume of hydrogen. As is apparent from the results achieved by practicing the process of the Example, such an atmosphere is entirely suitable. However, other inert gases could be substituted for the nitrogen, and the proportion of hydrogen could be increased or decreased, so long as the necessary result is achieved, namely, oxidation of the tin bath is prevented and a silicon coating is applied to the glass. Similarly, in the method of the Example, air was used to provide an oxidizing atmosphere in the lehr 12, but other oxidizing atmospheres can also be employed, for example, air enriched with either oxygen or nitrogen, or even one containing an inert gas other than nitrogen, so long as the required result of deposition of a tin or other oxide coating is achieved without undue detriment to the lehr itself.

In practicing the instant invention, a non-oxidizing gas which contains a silane is directed against a surface of the article to form a silicon coating on that surface. In the foregoing Example, the silane was mono-silane ($SiH_4$). However, the treating gas can contain other silanes, in addition to mono-silane, or in place thereof. Examples of other silanes that can be used include monochlorosilane ($ClSiH_3$), dichlorosilane ($Cl_2SiH_2$), other halosilanes, alkoxysilanes and di-tri- and higher silanes. Organosilanes, e.g., methyltrichlorosilane, are less desirable reactants than the silanes mentioned above, because it is difficult to break the silicon to carbon bond to form the desired silicon coating. Monosilane is the presently preferred treating agent for reasons of cost and availability and because the by-product of its use (hydrogen) does not constitute an ecological problem (contrast the chlorosilanes mentioned above, where the by-product is hydrogen chloride).

The procedure of the foregoing Example involved the treatment of the glass with a gas composed of 99 volume percent of air and 1 volume percent of tetramethyl tin, directed onto the glass from the distributor 28. The purpose of this treatment was to form a tin oxide coating over the silicon/silicon oxide layers that previously had been formed. An oxidizing atmosphere is required to enable tetramethyl tin to deposit a tin oxide coating. Air is a convenient oxidizing gas to use for this purpose, but air enriched with either oxygen or nitrogen or even another inert gas could be substituted for the air. A mixture of more than about 1½ volume percent of tetramethyl tin in air is flammable and, therefore, should be avoided. Other tin compounds can be substituted for tetramethyl tin, for example stannic chloride and various organo tin compounds that are available. The use of dibutyl tin diacetate to form a tin oxide coating on glass has been suggested (see Donley, identified above); this compound, however, because of its low vapor pressure, has been used as an organic solvent solution. The use of tetramethyl tin or of another tin or other metal compound which can be vaporized in air is strongly preferred for ecological and safety reasons. Indeed, titanium oxide coatings can be applied over the silicon and silicon oxide layers, for example using titanium tetrachloride, alumina coatings, for example using diethyl aluminum chloride, silica coatings, for example using monochlorosilane or methyldisilane, or combined titanium oxide/boron oxide/aluminum oxide coatings from mixtures of titanium tetrachloride, boron hydride and diethyl aluminum chloride.

In the foregoing Example, the glass temperature at the distributor 27 was 1175°±20° F. (635°±11° C.) and 970°±20° F. (521°±11° C.) under the gas distributor 28; the residence time of the glass in the oxidizing atmosphere (air) of the lehr 12, before it was treated with the air-tetramethyl tin gas from the distributor 28, was about 6 minutes; the non-oxidizing gas from the distributor 27 was composed of 86 volume percent of nitrogen, 10 volume percent of mono-silane and 4 volume percent of ethylene; and the oxidizing gas from the distributor 28 was composed of 99 volume percent of air and 1 volume percent of tetramethyl tin. These temperatures and gas compositions are all important variables in practicing the method of the instant invention. In general, the glass must be at a sufficiently high temperature that a silicon coating is formed by the gas from the distributor 27 and a metal oxide coating is formed by the gas from the distributor 28. The upper limit of temperature is determined by the physical properties of the glass; it must be sufficiently low that the viscosity of the glass is high enough to withstanding the necessary manipulations. In general, both the rate at which the silicon coating is formed and the rate at which the metal oxide coating is formed vary as direct functions of temperature. Accordingly, if lower temperatures are used, the silicon and metal oxide coatings form at slower rates and, if excessively low temperatures are used, multiple distributors are required to form these coatings at adequate thicknesses. The rate of coating formation also varies with the identity of the treating chemicals used; for example, chlorosilanes form silicon coatings at lower temperatures than does mono-silane, other factors being equal. As has been indicated above, the preferred treating compounds for use in practicing the method of the instant invention are mono-silane and tetramethyl tin. It is preferred that the glass surface be at a temperature of at least 1100° F. (593° C.) when treated with mono-silane and that the glass be at a temperature of at least 750° F. (398° C.) when the treatment with tetramethyl tin is carried out. Finally, the reflective silicon coating must oxidize sufficiently, before the metal compound is used to form a metal oxide coating, that pinholing does not occur to such an extent that the result is aesthetically unacceptable. The time required for the requisite degree of oxidation can be shortened by increasing the temperature or by increasing the oxygen partial pressure or, conversely, can be increased by reducing the temperature or by decreasing the oxygen partial pressure. It has been found that the extent of oxidation required to avoid pinholing depends upon the temperature at which the treatment with tin tetrachloride or the like is carried out. For instance, in the procedure of the foregoing Example the glass was at a temperature of 970°±20° F. (521°±11° C.) when the tetramethyl tin treatment was carried out, and there was a silicon oxide film from 20 to 50 A thick on the silicon. It has been found, however, that, with a silicon oxide film of this thickness, pinholing occurs if the tetramethyl tin treatment is carried out while the glass is at a temperature of 1170° F. (632° C.), but that tetramethyl tin treatment at this temperature can be carried out without pinholing if the silicon oxide coating is from 60 to 90 A thick.

The procedure of the foregoing Example included the step of washing the coated glass with dilute hydrofluoric acid, specifically, washing for ten seconds with 4 percent by weight hydrofluoric acid. As has been explained above, if this washing step is omitted, a film or haze forms on the coated glass article during tempering. While the film, generally a bluish-white splotchy defect, can be washed from the article after tempering has been completed, it is greatly advantageous to produce an article which is not subject to the formation of a film during tempering or other processing subsequent to the original production of the article. Accordingly, the ten second washing step with 4 percent by weight hydrofluoric acid, or an equivalent washing step, is preferably used in practicing the method of the instant invention. It has been found that both the concentration of the hydrofluoric acid and the length of the washing step can be changed from those used in the procedure of the foregoing example. For example, three inch (7.6 cm.) by six inch (15.2 cm.) glass samples which had coatings produced as described in the foregoing Example, except that the washing step was omitted, were used to determine the minimum immersion time in hydrofluoric acid of three different strengths required to prevent film formation on subsequent tempering. One-half of each sample tested was dipped in hydrofluoric acid and the sample was then tempered at 1300° F. (704° C.), five minutes at temperature. It was found that film formation upon tempering was prevented by a ten second or longer immersion in 3 percent by weight hydrofluoric acid, by an eight second or longer immersion in 4 percent by weight hydrofluoric acid, and by a six second or longer immersion in 6 percent by weight hydrofluoric acid. Immersion of up to 15 seconds in hydrofluoric acids of these three concentrations caused no visible deterioration of either the glass or the coating. It will be appreciated from an extrapolation of the foregoing data that film formation should be prevented by immersion for as little as four seconds in 10 percent by weight hydrofluoric acid and that hydrofluoric acid as dilute as 2½ percent by weight could be used to prevent film formation by increasing the immersion time to about twelve seconds; it will also be appreciated that other acid washes can be used provided that they are equivalents for those identified above in preventing filming during tempering without adversely affecting either the coating or the glass substrate. Agitation of the acid during washing of the coating, for example by brushing, is advantageous because it brings fresh acid to the surface.

It will be appreciated from the foregoing discussion that the instant invention is a continuous chemical vapor deposition method for producing a coated glass article. The method comprises the steps of continuously advancing the article, while hot, past first and second successive treating stations, at least the first of which is in a closed zone. A non-oxidizing atmosphere is maintained in a portion of the closed zone which includes the first treating station, while the second treating station is in an oxidizing atmosphere. A non-oxidizing gas which contains a silane is directed from the first treating station against a surface of the article to form a silicon coating on that surface. An oxidizing gas which includes a metal compound in the vapor phase is directed from the second treating station against the coated surface of the glass article. The temperature of the glass article, the residence time in the oxidizing atmosphere, in which the second treating station is situated, the composition of the non-oxidizing gas from the first treating station and the composition of the oxidizing gas from the second station are all controlled so that the silane-containing gas forms a reflective silicon coating on the glass surface, the oxidizing gas which includes a metal forms a coating of an oxide of the metal, and oxidation before the article reaches the second treating station forms a silicon oxide layer on the silicon which is of sufficient thickness that the metal oxide layer is substantially free of pinholing.

In the procedure described in the foregoing Example the non-oxidizing gas which was used in the distributor 27 to apply a reflective silicon coating contained ethylene in addition to mono-silane and nitrogen. The ethylene is important because it changes the nature of the silicon coating on the treated glass. It has been suggested that, chemically, the change is the formation of a combined silicon/silicon carbide coating on the glass; attempts to detect silicon carbide in the coating by analytical means, however, have been unsuccessful. In any event, it is clear that the coating is changed, because its resistance to alkali is significantly improved by comparison with that of the silicon coating produced when only nitrogen and mono-silane are employed. It has been found that other ethylenically unsaturated aliphatic hydrocarbons, acetylenically unsaturated aliphatic hydrocarbons and even aromatic hydrocarbons provided, in each case, that they are vaporized can be used in place of ethylene. Because of their greater toxicity, however, all other unsaturated hydrocarbons are less desirable than ethylene. A small amount of ethylene or other unsaturated hydrocarbon, for example from 4 to 5 volume percent with from 9 to 13 volume percent of a silane, balance nitrogen or other inert gas, is a preferred treating gas for producing the silicon coating according to the method of the instant invention.

Other changes and modifications from the specific details of the invention as disclosed above will be apparent to those skilled in the art and can be made without departing from the spirit and scope thereof if within the definitions of the appended claims.

We claim:

1. A coated article comprising a glass substrate, a reflective silicon coating adhered to a surface of the substrate, a layer of silicon oxide adjacent the surface of the silicon opposite that adhered to the substrate, and a metal oxide coating adhered to the silicon oxide layer, the silicon oxide layer being sufficiently thick that the metal oxide layer is substantially free of pinholing.

2. A coated article as claimed in claim 1 wherein said layer of silicon oxide is from about 20 to 50 A thick.

3. A coated article as claimed in claim 2, wherein said metal oxide layer is tin oxide.

4. A coated article as claimed in claim 1, wherein said layer of silicon oxide is from about 60 to 90 A thick.

5. A coated article as claimed in claim 4, wherein said metal oxide layer is tin oxide.

6. A coated article as claimed in claim 1, wherein said metal oxide layer is tin oxide.

7. A coated article comprising a glass substrate, a reflective silicon coating adhered to a surface of the substrate, a layer of silicon oxide adjacent the surface of the silicon opposite that adhered to the substrate, and a metal oxide coating adhered to the silicon oxide layer, the silicon oxide layer being sufficiently thick that the metal oxide layer is substantially free of pinholing, at least the coating of the article having been subjected to an acid wash to enable tempering of the article without the formation of a film thereon.

8. A coated article as claimed in claim 7, wherein said layer of silicon oxide is from about 20 to 50 A thick.

9. A coated article as claimed in claim 8, wherein said metal oxide layer is tin oxide.

10. A coated article as claimed in claim 9, wherein said glass substrate is a heat absorbing bronze colored glass of approximately 0.25 inch in thickness and said article has a shading coefficient of between 0.45 to 0.55, a daylight reflectance of approximately 45 percent, a daylight transmittance of approximately 25 percent, and a solar transmittance of approximately 30 percent.

11. A coated article as claimed in claim 9, wherein said glass substrate is a heat absorbing gray colored glass of approximately 0.25 inch in thickness and said article has as shading coefficient of approximately 0.45, a daylight transmittance of approximately 20 percent, a daylight reflectance of approximately 45 percent, and a solar transmittance of approximately 29 percent.

12. A coated article as claimed in claim 7, wherein said layer of silicon oxide is from about 60 to 90 A thick.

13. A coated article as claimed in claim 12, wherein said metal oxide layer is tin oxide.

14. A coated article as claimed in claim 7, wherein said metal oxide layer is tin oxide.

* * * * *